(12) United States Patent
Heil

(10) Patent No.: US 7,999,916 B2
(45) Date of Patent: Aug. 16, 2011

(54) MICROLITHOGRAPHIC PROJECTION EXPOSURE APPARATUS

(75) Inventor: Tilmann Heil, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 751 days.

(21) Appl. No.: 12/053,993

(22) Filed: Mar. 24, 2008

(65) Prior Publication Data

US 2008/0204875 A1 Aug. 28, 2008

Related U.S. Application Data

(63) Continuation of application No. PCT/EP2006/010397, filed on Oct. 28, 2006.

(60) Provisional application No. 60/733,087, filed on Nov. 3, 2005.

(51) Int. Cl.
*G03B 27/54* (2006.01)
*G03B 27/42* (2006.01)

(52) U.S. Cl. .......................... 355/67; 355/53

(58) Field of Classification Search ............ 355/71, 355/67
See application file for complete search history.

(56) References Cited

U.S. PATENT DOCUMENTS

| | | | |
|---|---|---|---|
| 6,285,443 B1 | 9/2001 | Wangler | |
| 6,295,443 B1 | 9/2001 | Matthew | |
| 6,388,736 B1 | 5/2002 | Smith et al. | |
| 6,404,499 B1 | 6/2002 | Stoeldraljer | |
| 6,522,483 B2 | 2/2003 | Kreuzer | |
| 6,535,273 B1 | 3/2003 | Maul | |
| 6,535,274 B2 | 3/2003 | Antoni | |
| 7,068,436 B2 | 6/2006 | Gruner | |
| 2004/0245439 A1 | 12/2004 | Shaver | |
| 2006/0077371 A1 | 4/2006 | Wegmann et al. | |
| 2006/0215272 A1 | 9/2006 | Gruner | |
| 2006/0268251 A1 | 11/2006 | Deguenther | |
| 2007/0024837 A1 | 2/2007 | Fiolka | |
| 2008/0032207 A1 | 2/2008 | Graeupner | |

FOREIGN PATENT DOCUMENTS

| | | |
|---|---|---|
| DE | 102 18 989 | 11/2003 |
| DE | 10 2007 021 649 | 11/2007 |
| EP | 1 170 635 | 1/2002 |
| WO | WO 01/02907 | 1/2001 |
| WO | WO 2005/006079 | 1/2005 |

*Primary Examiner* — Peter B Kim

(74) *Attorney, Agent, or Firm* — Fish & Richardson P.C.

(57) ABSTRACT

A microlithographic projection exposure apparatus is disclosed. The apparatus can have an illumination system for generating projection light, an absorption filter which has a varying absorption coefficient distribution, and a mask which is illuminated by the projection light. The mask can contain regions that differ from one another by the orientation of structures contained in them and whose transmissivity depends on the polarization state of the incident projection light. The absorption coefficient distribution of the absorption filter is determined so as to compensate at least partially for the dependence of the transmissivity of the region on the polarization state of the incident projection light.

21 Claims, 6 Drawing Sheets

MICROLITHOGRAPHIC PROJECTION EXPOSURE APPARATUS

CROSS-REFERENCE TO RELATED APPLICATIONS

This application is a continuation application and claims benefit of International Patent Application Serial No. PCT/EP2006/010397, filed on Oct. 28, 2006, which claims benefit and priority under §119 USC of U.S. provisional application 60/733,087, filed in the US Patent and Trademark Office on Nov. 3, 2005. The entire contents of these applications are incorporated herein in its entirety.

FIELD

The disclosure relates to microlithographic projection exposure apparatus, such as those used for the production of large-scale integrated electrical circuits and other microstructured components. The disclosure relates in particular to projection exposure apparatus for projecting masks having a polarization-dependent transmissivity.

BACKGROUND

Integrated electrical circuits and other microstructured components are conventionally produced by applying a plurality of structured layers onto a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A pattern of diffracting structures, which is contained in a mask, is thereby imaged onto the photoresist with the aid of a projection objective.

After the photoresist has been developed, the wafer is subjected to an etching process so that the top layer becomes structured according to the pattern on the mask. This process is repeated until all the layers have been applied on the wafer.

One of the main aims in the development of microlithographic projection exposure apparatus is to be able to generate structures with smaller and smaller dimensions on the wafer, so as to increase the integration density of the components to be produced. By employing a wide variety of measures, structures whose dimensions are less than the wavelength of the projection light being used can now be generated on the wafer.

One of these measures is to introduce an immersion liquid into an intermediate space between the projection objective and the wafer. This makes it possible, for example, to use projection objectives with a particularly high numerical aperture which may significantly exceed 1.

However, one effect of decreasing the structure size on the wafer is that the structures on the mask to be imaged also become smaller and smaller. Reduction of the imaging scale of the projection objective is generally avoided on cost grounds, since it may entail very wide-ranging technical changes in the design of the projection objectives. If the structure widths of the transparent structures contained in the mask are of the order of the wavelength of the projection light being used, or even significantly less, then effects that undesirably impair the optical imaging by the projection objective may occur in amplitude masks and most phase masks. In general, only masks which contain no opaque or light-attenuating structures do not exhibit these effects. The term amplitude masks refers to those masks in which—unlike in pure phase masks—it is not the phase but the amplitude of light passing through which is influenced. The opaque or light-attenuating structures are often structured layers of Cr or MoSi.

One of the aforementioned undesired effects, which occur with very small structure sizes in such masks, is that the mask has a polarizing effect on the projection light passing through. The most significant effect in this case can be that projection light whose polarization direction is aligned parallel with the longitudinal dimension of the structures will be transmitted better by these structures than projection light with a polarization direction perpendicular thereto. The effect of this polarization dependence of the transmissivity is that structures which are equivalent as such but are oriented differently will be imaged with different intensities on the photoresist. Owing to the sharp exposure threshold of the photoresist, variations in the quantity of light energy impinging per unit area (often referred to as exposure dose) can have a direct effect on the width of the structures lithographically generated on the wafer. Such a dependence of the structure widths on the orientation of the structures contained in the mask is generally undesirable.

Another polarizing effect of narrow structures, however, may be that projection light with a polarization aligned parallel with the longitudinal dimension of the structures propagates with a different velocity in the transparent structures than projection light with a polarization aligned perpendicularly thereto. This can lead to phase differences between mutually perpendicular polarization components, as similarly occur in retardation plates. Such phase differences are generally undesirable in masks, since they also cause the structure widths on the wafer to be dependent on the orientation of the structures contained in the mask. One reason for this is that certain optical elements in projection objectives, for example polarization-selective beam splitting layers, have a polarization-dependent transmissivity or reflectivity. In this way, for example, the conversion of linearly polarized light into elliptically polarized light in the mask may also affect the intensities and therefore the structure widths on the wafer.

Since the aforementioned birefringence of narrow structures also depends on the distances between adjacent structures, more densely arranged structures having identical widths will typically modify the state of polarization in a different manner than structures spaced apart by wider distances.

SUMMARY

In some embodiments, the disclosure provides a microlithographic projection exposure apparatus in which orientation-dependent structure width variations are reduced for masks with a polarization-dependent transmissivity.

In certain embodiments, the disclosure provides a method for correcting a microlithographic projection exposure apparatus in order to reduce structure widths variations in the image plane occurring with different arrangements of the structures contained in the mask.

In some embodiments, the disclosure provides a microlithographic projection exposure apparatus including an illumination system for generating projection light and an absorption filter which has a varying absorption coefficient distribution. A mask to be illuminated by the projection light has regions that differ from one another by the orientation of the structures contained in them and whose transmissivity depends on the polarization state of the incident projection light. According to the disclosure, the absorption coefficient distribution of the absorption filter is determined so as to compensate at least partially for the dependence of the transmissivity of the at least one region on the polarization state of the incident projection light.

In the ideal case, the absorption coefficient distribution is determined so that regions having equivalent but differently oriented structures transmit an equal amount of projection light.

The disclosure is based, in part at least, on the discovery that only light rays within a relatively narrow angle range contribute to the imaging of structures oriented along a particular direction. This offers the opportunity, when there is a dependence of the light intensity in the image plane of the projection objective on the structure orientation, to deliberately attenuate that part of the projection light which would otherwise contribute to the greater intensity in the image plane.

Since angles in the mask plane can be unambiguously associated with positions in a Fourier-related pupil plane, it is simplest for an absorption filter known per se, with a locally variation absorption coefficient distribution, to be arranged in or in the immediate vicinity of a pupil plane of the illumination system. The term immediate vicinity includes a region which extends for up to half the pupil diameter in the axial direction. Since the projection light which contributes to the imaging of structures oriented along one direction crosses the pupil plane at different positions than projection light which images structures orthogonal thereto, the desired part of the projection light can be selectively attenuated by controlled local distribution of the absorption coefficient.

In the simplest case, the absorption filter is a conventional gray value filter, with which it is even possible to achieve continuous distributions of the absorptivity in a straightforward way.

As an alternative to this, the absorption filter may also contain opaque narrow structures whose density is a measure of the average absorptivity. With combinations of a plurality of such filter elements, which are arranged mutually rotatably, the absorptivity can be adjusted almost continuously in particular segments.

Instead of an absorption filter which has a locally varying absorptivity and is arranged close to the pupil, it is also possible to use an absorption filter which has an absorptivity varying as a function of the angle and is arranged close to the field. Such absorption filters known per se in the prior art, however, suffer from disadvantages in respect of their production and handling. For this reason, such absorption filters will be considered in particular when insufficient space is available to install an absorption filter with a locally varying absorptivity close to the pupil.

In certain embodiments, a method includes:
a) providing a mask which contains different arrangements of structures;
b) providing a projection objective having an image plane;
c) imaging the mask into the image plane of the projection objective;
d) measuring how images of structures having identical widths depend on the arrangement of the structures;
e) determining an absorption coefficient distribution of an absorption filter, thereby taking account of measurement values obtained in step d), such that the dependency measured in step d) is reduced if the absorption filter is inserted in or in immediate proximity to a pupil plane of the projection exposure apparatus;
f) inserting the absorption filter, which has the absorption coefficient distribution determined in step e), in or in immediate proximity to the pupil plane.

It has been discovered that it is, at least generally, simpler first to determine the dependence of the structure widths on the structure orientation by measurements. It is then relatively simple to determine an absorption coefficient distribution of the absorption filter such that the dependency measured in step d) is reduced.

The same applies also for the dependence of the structure widths on the distances between adjacent structures. As has been mentioned above, more densely arranged narrow structures having identical widths modify the state of polarization in a different manner than identical structures spaced apart by wider distances. These modifications of the state of polarization generally results in structure width variations on the wafer.

Optionally, the absorption filter is arranged in or in immediate proximity of a pupil plane of the illumination system of the projection exposure apparatus. However, the absorption filter may alternatively (or even additionally) be arranged in the projection objective. This is because also in a projection objective the rays contributing to the images of structures having a certain orientation pass through certain areas in a pupil plane of the projection objective. The location of these areas can be determined by ray tracing methods if the diffraction properties of the mask are known.

BRIEF DESCRIPTION OF THE DRAWINGS

Various features and advantages of the present disclosure may be more readily understood with reference to the following detailed description taken in conjunction with the accompanying drawing in which.

DETAILED DESCRIPTION

Figure 1:
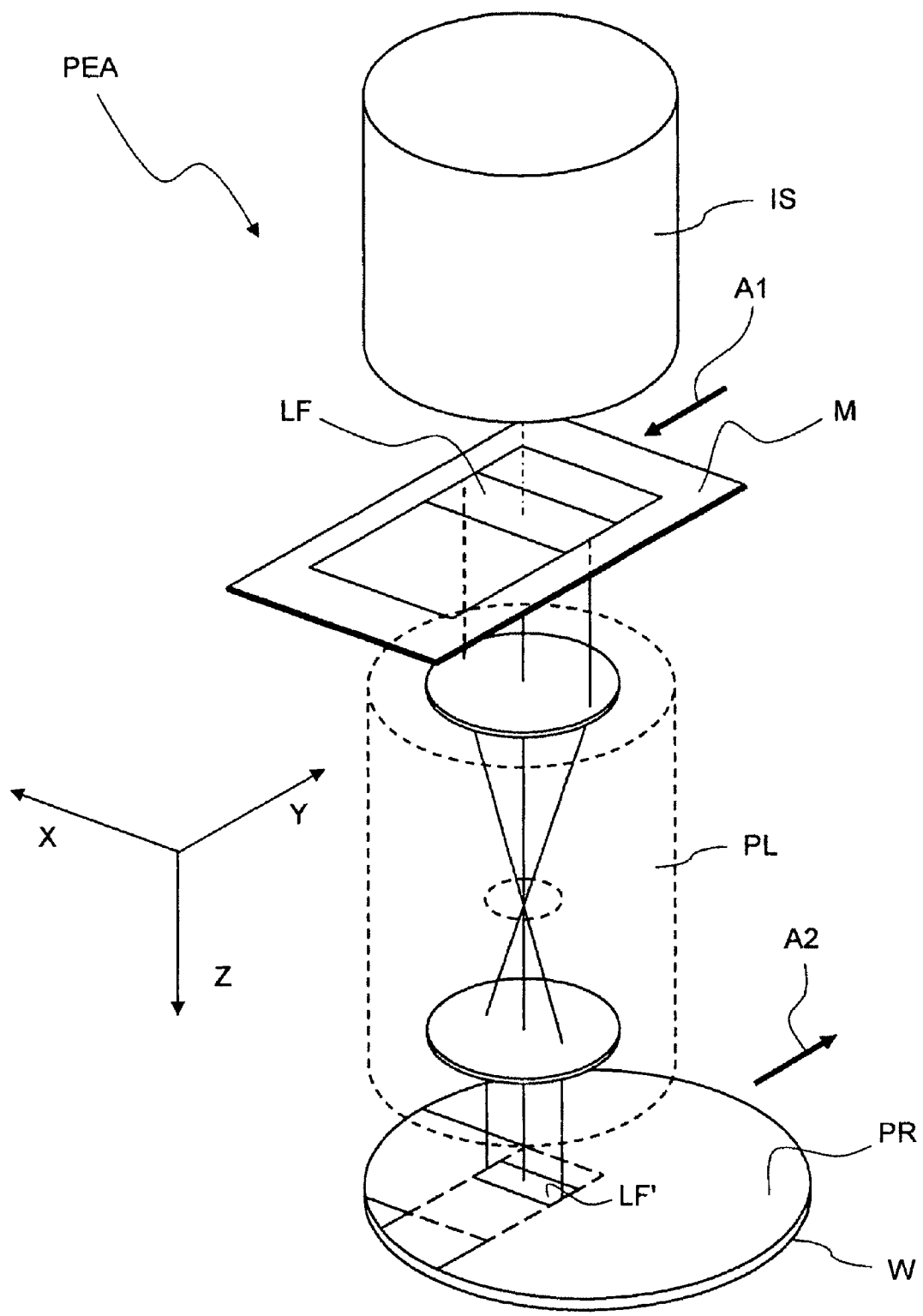
FIG. 1 shows a microlithographic projection exposure apparatus in a simplified perspective representation.

FIG. 1 shows a projection exposure apparatus PEA in a highly schematic representation which is not true to scale. The projection exposure apparatus PEA includes an illumination system IS for generating a projection light beam. On a mask M which contains structures to be projected, this beam illuminates a narrow light field LF which is rectangular in the embodiment represented. The transparent structures of the mask M which lie inside the light field LF are imaged onto a photoresist PR with the aid of a projection objective PL. The photoresist PR is a photosensitive layer which is applied onto a wafer W or another support, and whose surface lies in the image plane of the projection objective PL. Since the projection objective PL generally has an imaging scale which is less than 1, a reduced image of the part of the mask M lying in the region of the light field LF is formed as a region LF' on the photoresist PR.

In the embodiment represented, the mask M and the wafer W are displaced along a Y direction during the projection. The ratio of the displacement rates is equal to the imaging scale of the projection objective PL. If the projection objective PL generates inversion of the image, then the displacement motions of the mask M and the wafer W will be opposite as indicated by arrows A1 and A2 in FIG. 1. The light field LF is thereby guided over the mask M in a scanning motion, so that even sizeable structured regions can be coherently projected onto the wafer W.

Figure 2:
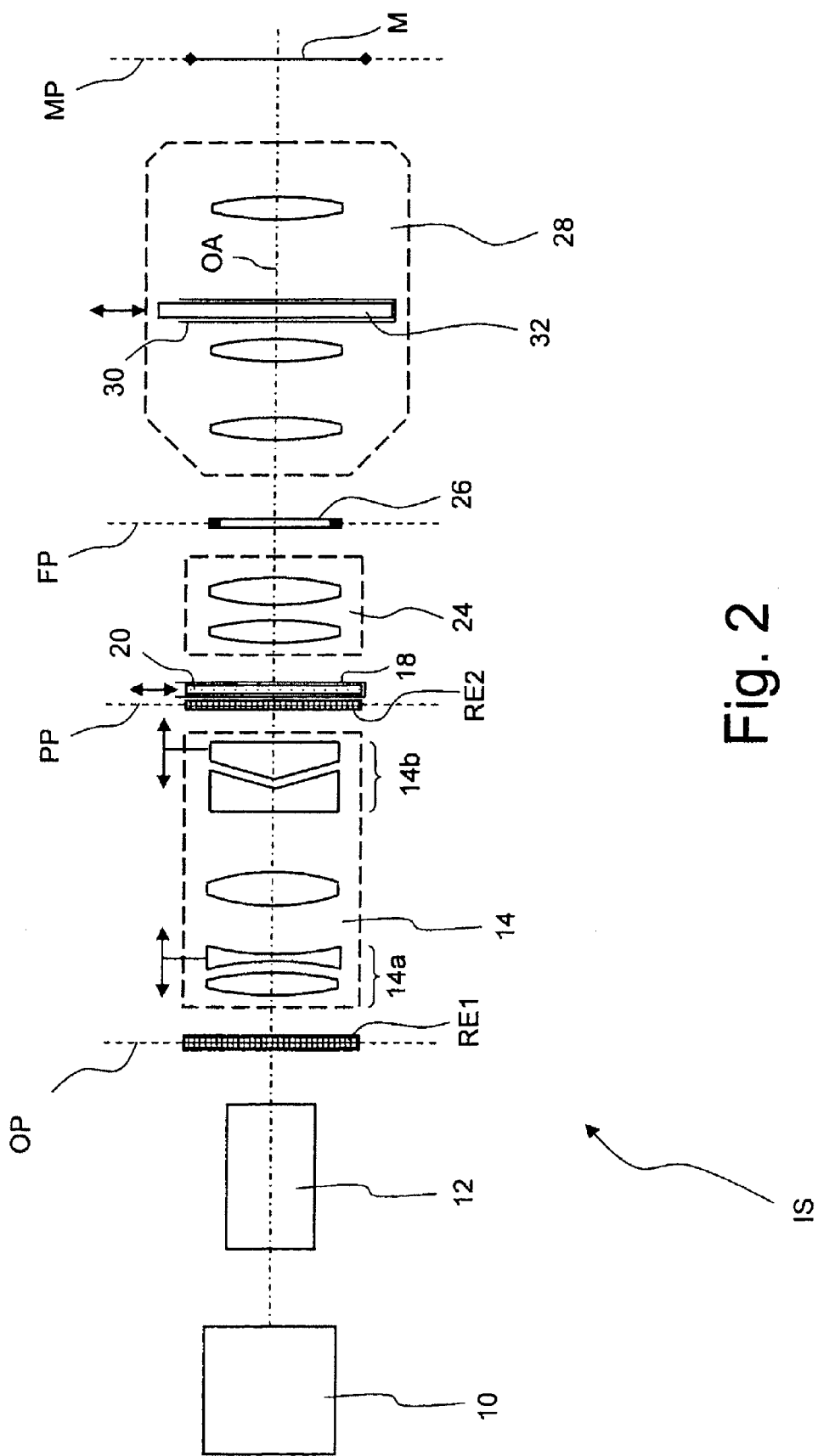
FIG. 2 is a simplified meridian section of an illumination system of the projection exposure apparatus shown in FIG. 1.

FIG. 2 shows the illumination system IS, only schematically indicated in FIG. 1, in a simplified meridian section which is not true to scale.

A light source 10, for example embodied as an excimer laser, generates monochromatic and highly collimated light with a wavelength in the deep ultraviolet spectral range, for example 193 nm or 157 nm. In a beam expander 12, which may for example be an adjustable mirror arrangement, the light generated by the light source 10 is expanded into a rectangular and substantially parallel ray bundle. The expanded ray bundle subsequently passes through a first optical raster element RE1 which, for example, may be a diffractive optical element. Other examples of suitable raster elements are described in the applicant's U.S. Pat. No. 6,295,443, the disclosure of which is fully incorporated herein by reference. The purpose of the first optical raster element RE1 is to change the illumination angle distribution of the projection light and increase the geometrical optical flux.

The first optical raster element RE1 is arranged in an object plane OP of a beam shaping objective 14, which can further modify and continuously change the illumination angle distribution. To this end the beam shaping objective 14 contains a zoom group 14a, which has at least one adjustable lens, and an axicon group 14b. The axicon group 14b includes two axicon elements with conical surfaces having a variable spacing.

A second optical raster element RE2 is arranged in a pupil plane PP, which may be the exit pupil of the beam shaping objective 14. The purpose of the second optical raster element RE2 is to establish the local intensity distribution in the mask plane MP, where the mask M is positioned with the aid of a positioning instrument (mask stage) not represented in detail. An exchange holder 18, which is intended to hold a pupil filter 20, is provided in the immediate vicinity of the pupil plane PP. The pupil filter 20 will be described in more detail below with reference to FIGS. 6 to 10.

A condenser group 24, which conjugates the pupil plane PP with a field plane FP, is arranged behind the second optical raster element RE2 in the light propagation direction. A field stop 26, which defines the edge of the light field LF illuminating the mask M, is arranged in the field plane FP. To this end the field stop 26 may include a few adjustable blades or a larger number of narrow finger-like stop elements, as is described in U.S. Pat. No. 6,404,499 B1. The field stop 26 is imaged onto the mask plane MP by a masking objective 28.

If necessary, a glass rod for beam homogenization may also be interposed between the condenser group 24 and the field stop 26, as is described in the aforementioned U.S. Pat. No. 6,285,443 B.

A further exchange holder 30, into which a polarizer 32 for generating linearly polarized light can be inserted if need be, is arranged in a pupil plane of the masking objective 28. In the ideal case, the polarizer 32 would not be necessary since the projection light normally generated by lasers is in general initially polarized linearly to a high degree. In real optical systems, however, the degree of polarization of the light generally decreases more or less strongly. The causes of this are, for example, polarization-depended coatings of lenses, mirrors and other optical elements, as well as the birefringence of certain optical materials. The effect achieved by arranging the polarizer 32 relatively close to the light exit side of the illumination system IS is that only the relatively few optical elements between the polarizer 32 and the light exit side can then contribute to perturbing the polarization state.

Figure 3:
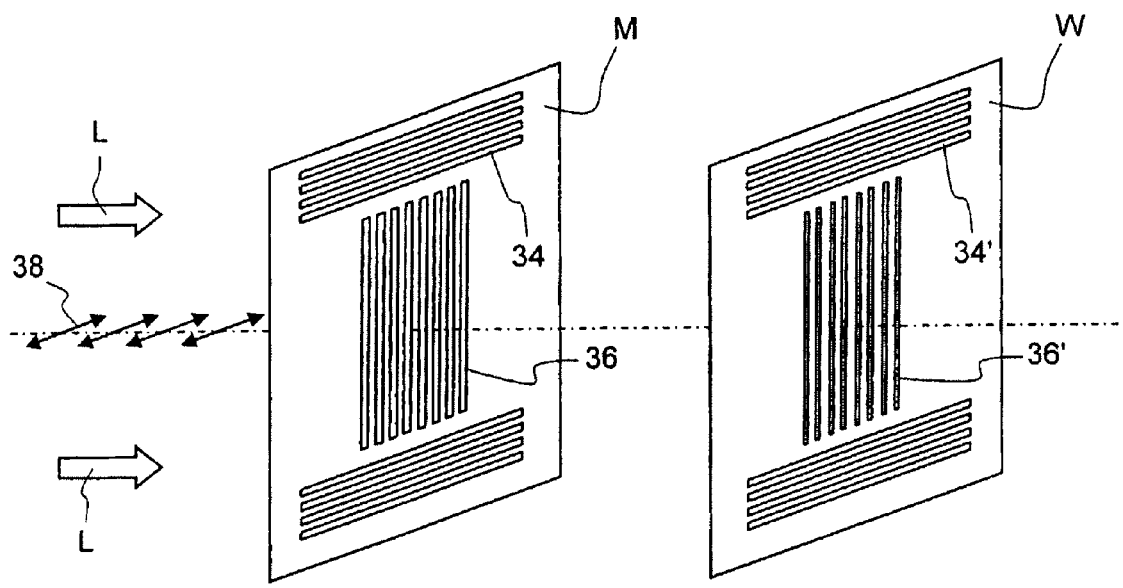
FIG. 3 shows a mask illuminated with linearly polarized light, and structures thereby generated on a wafer, in a highly schematic perspective representation.

On the left, FIG. 3 shows a highly schematic and not true to scale perspective representation of the mask M which, for example, may contain a simple pattern of horizontal and vertical transparent structures 34 and 36, respectively. The transparent structures 34, 36 are obtained by structuring an initially continuous chromium layer, which is opaque for projection light L. For the sake of simplicity, it is assumed here that the horizontal and vertical structures 34 and 36 differ from one another merely in respect of their orientation, but not in the width or spacing.

It will be assumed below that the polarizer 32 generates linearly polarized light L, which is polarized along the horizontal structures 34. The polarization direction is indicated by double arrows 38 in FIG. 3. It is furthermore assumed that the widths of the structures 34, 36 are of the order of the wavelength $\lambda$ of the projection light L. Under these circumstances, the horizontal structures 34 have a greater transmissivity than the vertical structures 36 for the projection light L. The horizontal and vertical structures 34 and 36 are therefore not imaged onto the photoresist PR with the same intensity. Owing to the sharp exposure threshold of the photoresist PR, these intensity differences lead to undesirable width differences of the structures generated on the wafer W after exposure. The smaller the structures to be imaged are on the mask M, the greater are the undesirable width differences for differently oriented structures.

Figure 4:
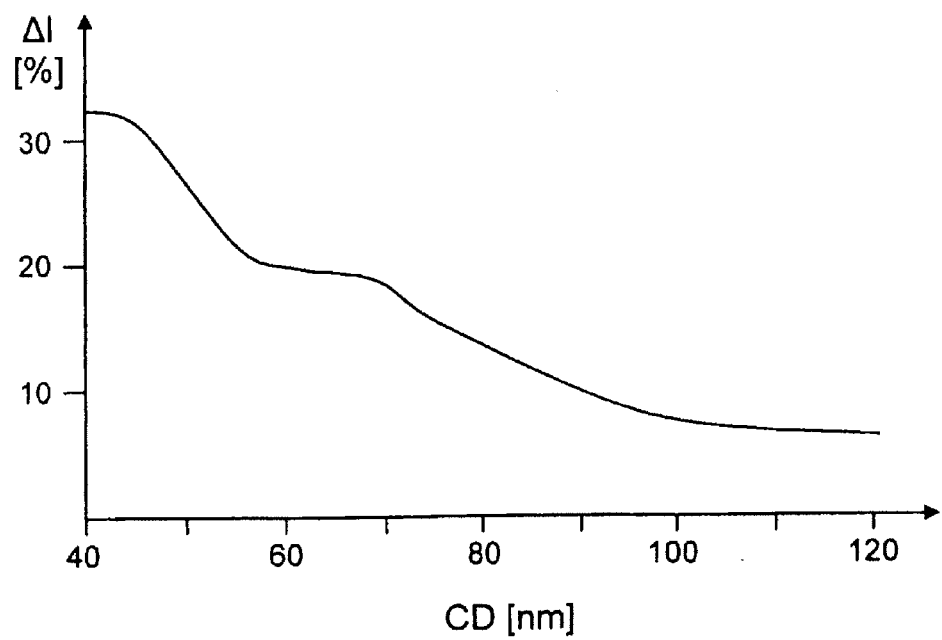
FIG. 4 is a graph in which the percentage intensity differences for differently oriented structures are plotted as a function of the structure width.

FIG. 4 shows a graph in which this dependence is depicted for an exemplary mask, which has been projected with projection light of the wavelength $\lambda$=193 nm. The percentage intensity difference $\Delta I$ is plotted there for linearly polarized projection light which passes through structures oriented along the polarization direction and structures oriented perpendicularly thereto, as a function of the width CD (critical dimension) of the structures generated on the wafer W. The percentage intensity difference $\Delta I$ is defined as $(T_p-T_n)/(T_p+T_n)$, with $T_p$, $T_n$ being the transmissivity for light polarized parallel and normal to the orientation of the structures, respectively. Even with a structure width of 65 nm, the intensity of the projection light which has passed through a structure extending along the polarization direction is about 50% greater than the intensity when passing through a structure oriented perpendicularly thereto.

The width differences resulting from this, owing to the sharp exposure threshold, of the structures generated on the wafer W after exposure of the photoresist PR are represented on the right of FIG. 3 schematically and greatly exaggerated. As can be seen clearly, the vertical structures 36' on the wafer W are narrower than the horizontal structures 34', even though the imaged structures 34, 36 have the same width on the mask M.

Owing to the aforementioned dependence of the transmissivity of the mask M on the structure orientation with linearly polarized light, it is generally more expedient to illuminate masks having differently oriented structures with unpolarized or circularly polarized light. The proportion of the light polarized parallel to the structure orientation is then equal for all the structure orientations. Consequently, the transmissivity no longer depends on the orientation of the structures. In order to generate unpolarized light, for example, a Hanle depolarizer may be arranged between the first optical raster element RE1 and the beam shaping objective 14, as described in U.S. Pat. No. 6,535,273 B1. Circularly polarized light can be generated in the illumination system IS by arranging a quarter-wave plate behind the polarizer 32, for example.

In general, however, it is difficult to generate perfectly unpolarized light (i.e. light with a degree of polarization equal to zero) since many optical elements in the illumination system IS transmit or reflect polarization-dependently. For example, illumination systems often contain one or more (not shown in FIG. 2) plane deviating mirrors, one of which may for example be arranged in the masking objective 28. The reflectivity of the mirror coating is almost inevitably polarization-dependent. This results in a residual degree of polarization which is constant over the field. The same applies when generating circularly polarized light, which will be converted by such perturbations into light weakly polarized elliptically.

A linear polarization component, for which the relationships explained above in connection with FIGS. 3 and 4 accordingly apply, can be associated with the residual degree of polarization or the component causing the ellipticity. In this way, a residual polarization or elliptically polarized light can likewise lead—albeit in a quantitatively lesser extent—to undesirable width variations of the structures generated on the wafer, as a function of their orientation.

Figure 5:
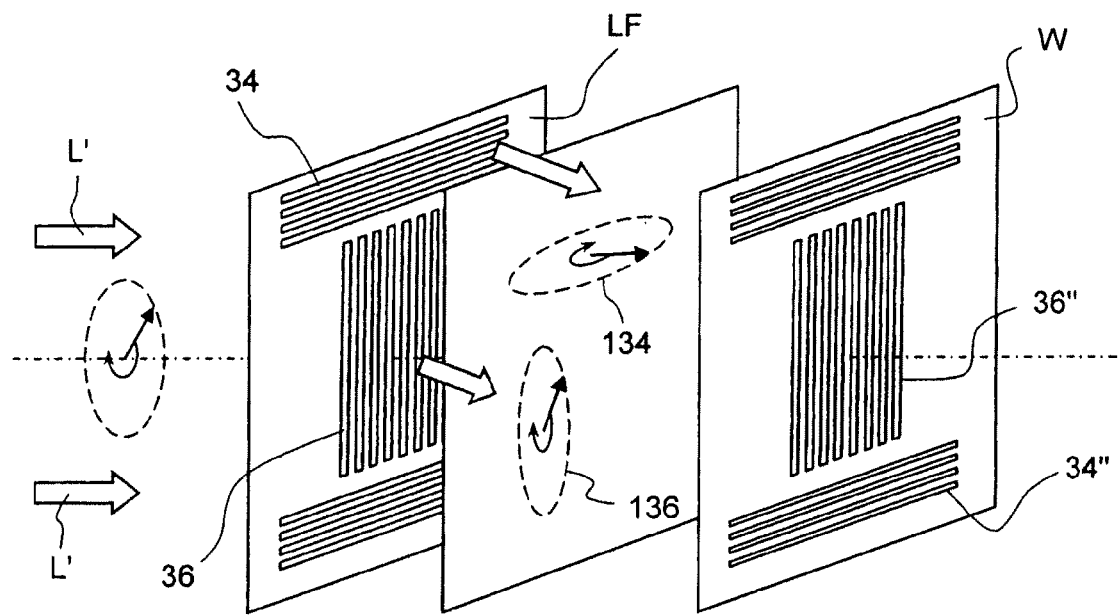
FIG. 5 is an illustration corresponding to FIG. 3, but for the case of illumination with circularly polarized light.

Such variations, however, may occur even if the mask M is illuminated with perfectly unpolarized or circularly polarized projection light. FIG. 5 shows the latter case, in which the mask M is illuminated with light L' perfectly polarized circularly. The effect of the different transmissivity for the polarization components of the projection light L', polarized perpendicularly and parallel to the transparent structures 34, 36, is that the projection light L' is differently polarized elliptically after passing through the mask M. The ellipses 134, 136, by which these elliptical polarizations can be described, are mutually perpendicular.

If the projection objective PL contains polarization-dependent optical elements, for example a polarization-selective beam splitter layer or lenses made of birefringent material, then the result of this in conjunction with the polarizing effect of the structures 34, 36 is that the structures 34", 36" generated on the wafer W will have orientation-dependent widths.

So that equivalent but differently oriented structures on the mask M are imaged onto the photoresist PR with the same intensity, the pupil filter 20 arranged in the immediate vicinity of the pupil plane PP has an azimuthally varying absorption coefficient distribution. This utilizes the fact that only those light rays which arrive on the mask M within a relatively narrowly restricted angle range contribute to imaging the structures 34 extending horizontally. In the pupil plane PP, these rays that contribute to the imaging pass through two poles which are denoted by H1, H2 in FIG. 6. The two poles H1, H2 each have an approximately circular shape and are arranged diametrically opposite each other at equal distances from an optical axis OA of the illumination system IS. All the other light rays which cross the pupil plane PP through regions outside the two poles H1, H2 generate a kind of background noise, which reduces the contrast on the photoresist and is therefore undesirable.

Figure 6:
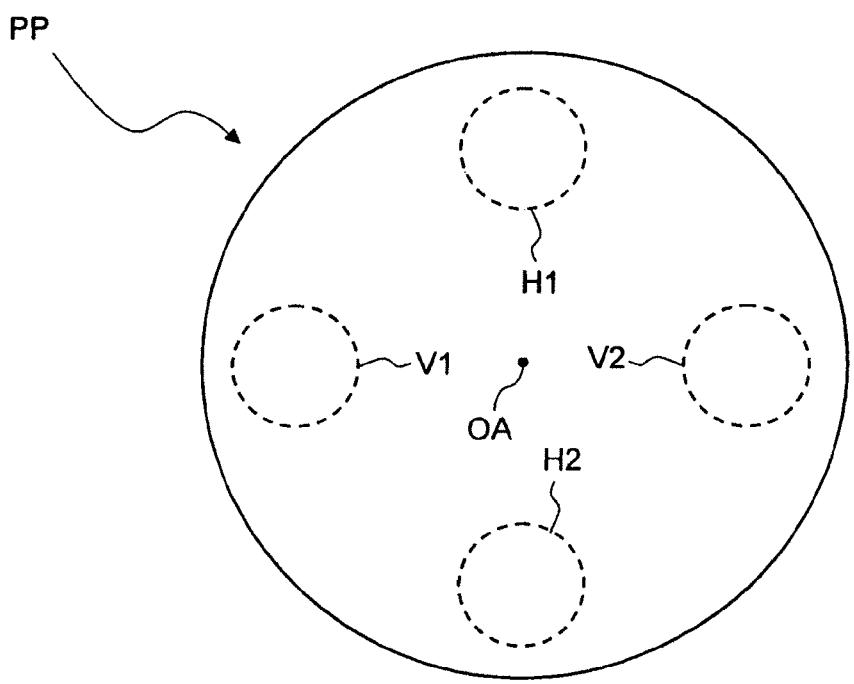
FIG. 6 shows a possible intensity distribution in a pupil plane of the illumination system when imaging masks with differently oriented structures.

The same moreover applies for the vertical structures 36. The light rays contributing to their imaging cross the pupil plane PP in the region of two poles V1, V2, which are likewise arranged diametrically opposite each other at equal distances from the optical axis OA. The two pairs of poles H1, H2 and V1, V2 are arranged mutually offset by 90°, so as to create the twofold symmetry of the poles as shown in FIG. 6.

To increase the contrast in such a case, the illumination system IS is usually designed so that only the poles H1, H2 and V1, V2 are illuminated in the pupil plane PP. To this end, in the simplest case, a diaphragm with four circular openings is introduced into the pupil plane PP. In order to minimize light losses at the diaphragm, the first optical raster element RE1 may be selected, and the beam shaping objective 14 may be adjusted, so that the projection light emerging from the beam shaping objective 14 essentially illuminates only the poles H1, H2 and V1, V2.

Since the horizontal structures 34 are imaged with a greater intensity than the vertical structures 36 in the constellation shown in FIG. 3, which also occurs in principle in the case of a residual polarization with a polarization direction 38, only those light rays which contribute to imaging the horizontal structures 34 are attenuated with the aid of the pupil filter 20. Since these light rays only pass through the two poles H1, H2, the pupil filter 20 is configured so that attenuation relative to the poles V1, V2 takes place in the region of the poles H1, H2.

Figure 7:
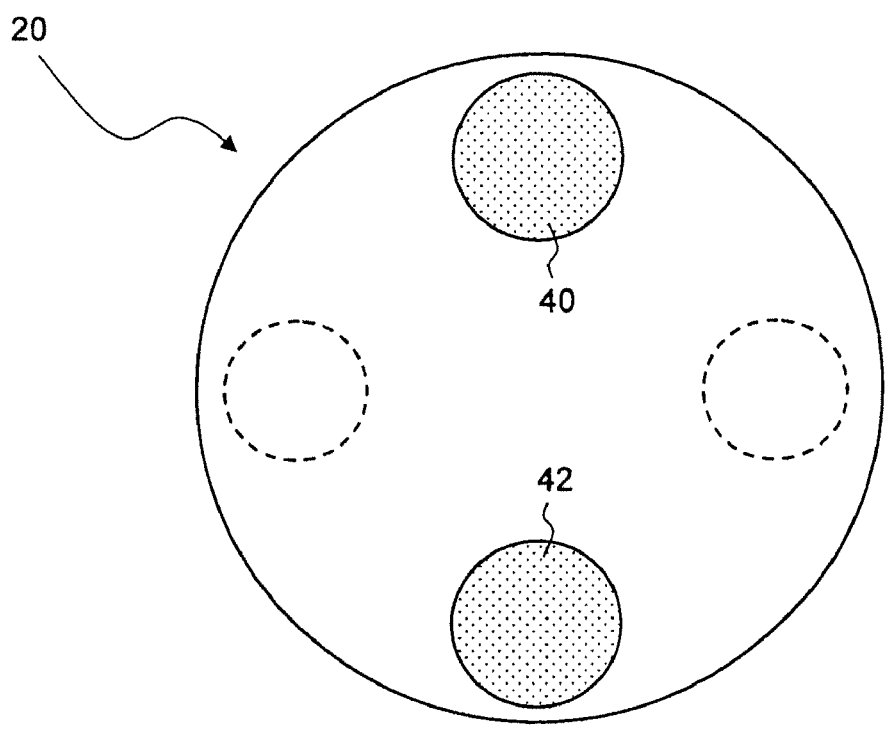
FIG. 7 is a plan view of an absorption filter with which it is possible to compensate for orientation-dependent structure width variations.

FIG. 7 shows the pupil filter 20 according to an embodiment in a plan view. The pupil filter 20 is designed here as a gray value filter known per se, in which regions 40, 42 with increased absorptivity are represented as dotted. In angular terms, the pupil filter 20 is introduced in or in the vicinity of the pupil plane PP so that the regions 40, 42 fully cover the poles H1, H2 to be attenuated. The absorptivity of the pupil filter 20 should be as close as possible to 0% outside the regions 40, 42, so that no unnecessary light losses occur.

The value to which the absorptivity must be increased inside the regions 40, 42, so that the width of the structures generated on the wafer W is independent of their orientation, depends on the conditions of the particular case. Since the polarization-perturbing influences of the other components of the projection exposure apparatus are also partially attributable to material defects or manufacturing tolerances, it is generally difficult to pre-calculate exactly the absorption inside the regions 40, 42 with which the best possible orientation independence of the structure widths will be achieved on the wafer.

Therefore it will, at least generally, be simpler first to determine the dependence of the structure widths on the structure orientation by measurements. It is then relatively simple to establish how great the absorption in the regions 40, 42 must be so as to achieve maximally orientation-independent structure widths.

Figure 8:
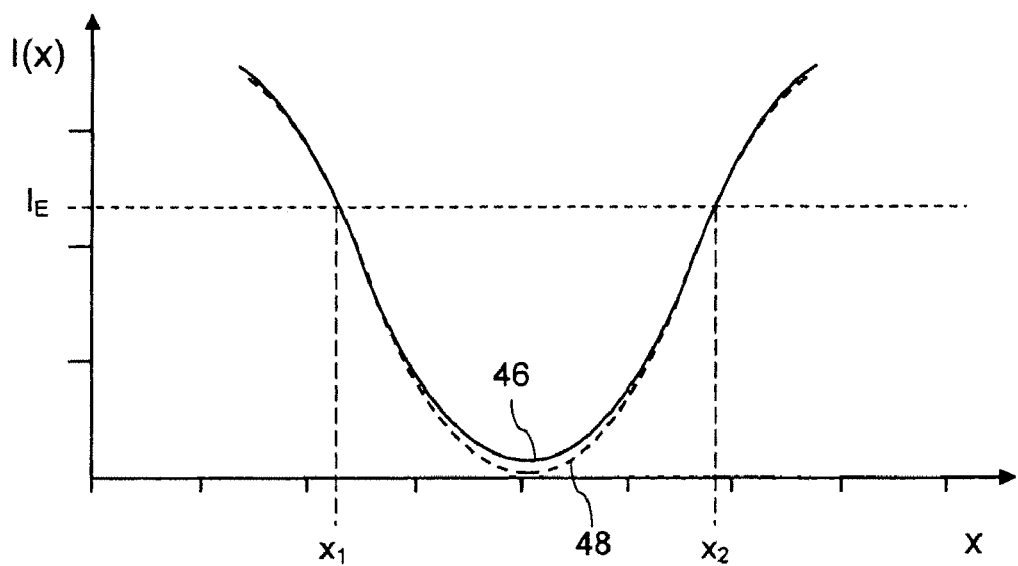
FIG. 8 is a graph in which the intensity profile of the projection light arriving on the photoresist is plotted transversely to the structure orientation, the absorption filter shown in FIG. 7 being used.

In FIG. 8, the intensity profile I(x) of the projection light L arriving on the photoresist PR is plotted as a function of a coordinate x indicating the position transversely to the structure orientation. It is assumed here that the pupil filter 20 is placed in the exchange holder 18. The solid line 46 illustrates the intensity for the vertical structures 36, and the line represented by dashes illustrates the intensity of the horizontal structures 34. The exposure threshold $I_E$ of the photoresist PR is reached at the same positions $x_1$, $x_2$, so that the structures defined by exposing the photoresist PR and generated on the wafer W have the same width $x_2-x_1$ independently of the orientation.

Figure 9:
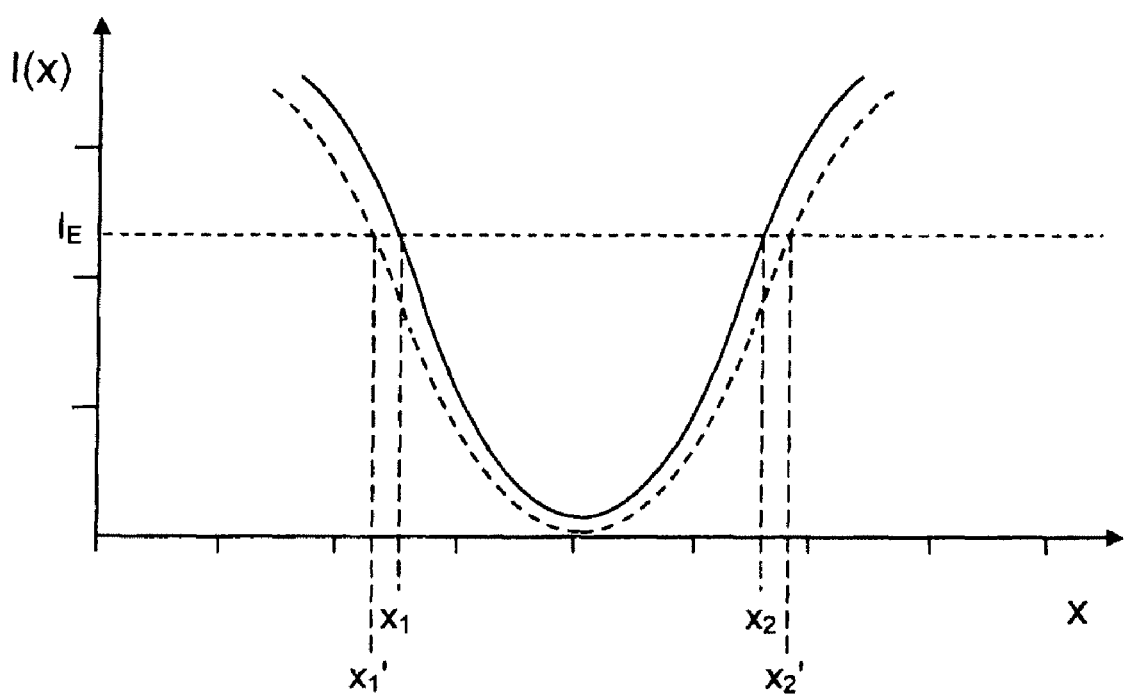
FIG. 9 is a graph corresponding to FIG. 8, but for a projection exposure apparatus without the absorption filter shown in FIG. 7.

For comparison, FIG. 9 shows the intensity distribution I(x) for the case in which the pupil filter 20 is removed from the exchange holder 18. The horizontal structures 34 are now imaged with a higher intensity so that—for an equal exposure time—the exposure threshold $I_E$ is reached at positions $x_1'$, $x_2'$ lying further outside. The structure width $x_2'-x_1'$ generated in this way for horizontal structures is therefore greater than the structure width $x_2-x_1$ of the vertical structures.

It is to be understood that other regions of the pupil plane PP will be illuminated when there are structures oriented differently on the mask M. The local absorption coefficient distribution will then need to be adapted accordingly.

Instead of a gray value filter, it is of course also possible to use another type of absorption filter with which it is possible to achieve an absorption that varies locally and, in particular, azimuthally. The regions need not necessarily have a constant absorptivity over the poles to be attenuated. In particular, it is conceivable to arrange thin opaque structures, for example radially extending wires, with a differing density over the poles. If a plurality of filter elements having such wires are arranged above one another, then the average absorptivity over the poles to be attenuated can be adjusted almost continuously by relative rotation of the filter elements. Further details of this can be found, for example, in U.S. Pat. No. 6,535,274 A.

What is claimed is:

1. A method, comprising:
   imaging a mask into an image plane of a projection objective of a microlithography projection exposure apparatus, the mask including different arrangements of structures;
   measuring how images of structures of the mask having identical widths depend on an arrangement of the structures to obtain measurement values; and
   inserting an absorption filter in or in immediate proximity to a pupil plane of the projection exposure apparatus, the absorption filter having an absorption coefficient distribution based on the obtained measurement values so that inserting the filter in or in immediate proximity to the pupil plane of the projection exposure apparatus reduces a dependency of images of the structures of the mask having identical widths on the arrangement of the structures.

2. The method of claim 1, wherein the different arrangements of structures differ from one another by an orientation of the structures.

3. The method of claim 1, wherein the different arrangements of structures differ from one another by a distance between adjacent structures.

4. The method of claim 1, wherein the pupil plane of the projection exposure apparatus is arranged in an illumination system of the projection exposure apparatus.

5. The method of claim 1, wherein the pupil plane of the projection exposure apparatus is arranged in the projection objective of the projection exposure apparatus.

6. The method of claim 1, wherein the method includes measuring widths of structures imaged into the image plane, and the measured widths are compared to the widths of corresponding structures in the mask.

7. The method of claim 1, wherein the projection exposure apparatus comprises an illumination system and a projection objective, and the method further comprises:
   after inserting the absorption filter in or in immediate proximity to the pupil plane of the projection exposure apparatus, using the illumination system to illuminate the mask; and
   using the projection objective to project an image of the illuminated mask onto a wafer coated with photoresist.

8. An apparatus, comprising:
   an illumination system configured to generate projection light, the illumination system comprising an absorption filter having an absorption coefficient distribution that can vary; and
   a mask that includes structures, the mask being illuminated by the projection light during use of the apparatus, and the mask having regions that differ from one another by an orientation of the structures and that have a transmissivity depending on the polarization state of the projection light,
   wherein the absorption coefficient distribution of the absorption filter is determined so that, during use of the apparatus, the absorption filter compensates at least partially for the dependence of the transmissivity of the regions on the polarization state of the incident projection light, and the apparatus is a microlithographic projection exposure apparatus.

9. The apparatus according to claim 8, wherein the absorption coefficient distribution of the absorption filter is determined so that, during use of the apparatus, regions of the mask having equivalent but differently oriented structures transmit an equal amount of the projection light.

10. The apparatus according to claim 8, wherein the absorption coefficient distribution varies locally or as a function of an angle of the projection light.

11. The apparatus according to claim 10, wherein the absorption coefficient distribution of the absorption filter varies locally, and the absorption filter is arranged in or in the immediate vicinity of a pupil plane of the illumination system.

12. The apparatus according to claim 11, wherein the absorption coefficient distribution of the absorption filter varies azimuthally.

13. The apparatus according to claim 12, wherein the absorption coefficient distribution of the absorption filter has a twofold symmetry.

14. The apparatus according to claim 13, wherein the absorption filter has two first filter regions lying diametrically opposite each other, inside which the absorptivity has a constant first value, and wherein the absorption filter has two second filter regions lying diametrically opposite each other, inside which the absorptivity has a constant second value which is different than the first value.

15. The apparatus according to claim 8, wherein the absorption filter is a gray value filter.

16. The apparatus according to claim 8, wherein:
   the mask has a first region with first structures which are oriented along a first direction;
   the mask has a second region with second structures which are oriented along a second direction different than the first direction; and
   during use of the apparatus, the transmissivity of the first region for a polarization component of the projection light which is linearly polarized along the first direction differs from the transmissivity for a polarization component with a polarization direction perpendicular thereto.

17. The apparatus according to claim 16, wherein, during use of the apparatus, projection light that contributes to imaging the structures of the first region crosses a pupil plane of the illumination system at different positions than projection light that contributes to imaging the structures of the second region.

18. The apparatus according to claim 17, wherein during use of the apparatus:

the positions where the first projection light crosses the pupil plane of the illumination system are two first poles lying diametrically opposite each other;

the positions where the second projection light crosses the pupil plane of the illumination system are two second poles lying diametrically opposite each other; and the two first poles are offset by 90° relative to the two second poles.

19. The apparatus according to claim 8, wherein the projection light has a wavelength $\lambda$ and the structures on the mask are sized so that, during use of the apparatus, the transmissivity of the structures oriented in different directions at the wavelength $\lambda$ depends on the polarization state of the incident projection light.

20. The apparatus according to claim 8, further comprising a projection objective configured to image the mask onto a photosensitive layer.

21. A method, comprising:

providing an illumination system configured to generate projection light;

providing a mask that contains structures, the mask having regions that differ from one another by an orientation of the structures and have a transmissivity depending on the polarization state of the incident projection light; and introducing an absorption filter into the illumination system, the absorption filter having an absorption coefficient distribution configured to compensate at least partially for the dependence of the transmissivity of the regions on the polarization state of the incident projection light.

* * * * *